United States Patent [19]

Spence-Bate

[11] Patent Number: 4,734,315
[45] Date of Patent: Mar. 29, 1988

[54] LOW POWER CIRCUITRY COMPONENTS

[75] Inventor: Harry A. H. Spence-Bate, Morley, Australia

[73] Assignee: Joyce Florence Space-Bate, Australia

[21] Appl. No.: 870,996

[22] Filed: Jun. 5, 1986

[30] Foreign Application Priority Data

Jun. 5, 1985 [AU] Australia .............................. PH0897

[51] Int. Cl.⁴ .......................... B32B 3/10; B32B 3/00; H01B 7/34; H02B 1/00
[52] U.S. Cl. ................................... 428/209; 428/131; 428/195; 428/901; 174/16 R; 361/383; 361/384; 361/412; 361/414
[58] Field of Search .............. 428/195, 209, 901, 131; 174/16 R; 361/383, 384, 412, 414

[56] References Cited

U.S. PATENT DOCUMENTS

| 4,393,437 | 7/1983 | Bell et al. ............................ 361/383 |
| 4,417,297 | 11/1983 | Oyama et al. ....................... 361/412 |
| 4,587,594 | 5/1986 | McPherson ......................... 361/383 |

FOREIGN PATENT DOCUMENTS 2015361 6/1979 Fed. Rep. of Germany ...... 361/383
874796 8/1961 United Kingdom ................ 361/383

OTHER PUBLICATIONS

IBM Tech. Disclosure Bulletin, vol. 15, No. 6, Nov. 1972, Electrical Interconnect Structure for Laminate Assemblies, pp. 1999-2000.

*Primary Examiner*—John E. Kittle
*Assistant Examiner*—Patrick J. Ryan
*Attorney, Agent, or Firm*—Franklin D. Wolffe; Morris Fidelman

[57] ABSTRACT

A low power electrical circuitry component is made from several laminae stacked one on top of the next; at least two of the laminae are provided with circuitry, suitably printed circuitry with electrical connections between circuit elements of the circuitry on one lamina interconnected with those elements of the next or subsequent such laminae by means of connections substantially perpendicular to the planes of the laminae; apertures or recesses may be formed in some of the laminae to provide holders for wafers and other circuitry items so that the laminae provide a strong frame and encapsulation for wafers and so on; ducts may be provided in or between laminae for cooling.

5 Claims, 14 Drawing Figures

CIRCUITRY WITHOUT
INPUT-OUTPUT
PLATES

SECTION

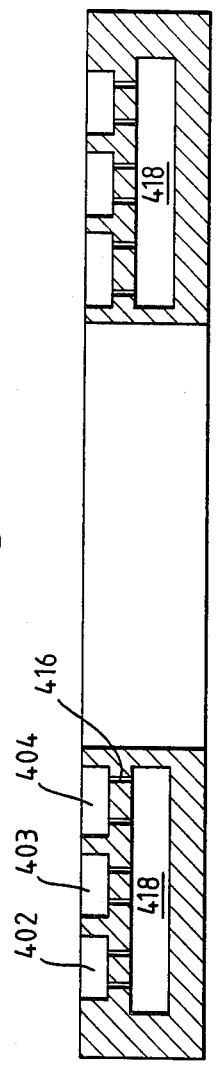

LOW POWER CIRCUITRY COMPONENTS

The present invention relates to low power electrical circuitry components. Complicated low power electrical circuitry commonly includes printed circuit boards to which resistors, transistors, chips and so on are soldered. As such circuitry becomes more complicated so the printed circuits on the boards become disproportionally more complex and often a requirement for one or more lines on the printed circuit to cross over another requires extensive rerouting and in many cases redesign.

It is one object of the invention to overcome the problems of cross over and to make a more adaptable circuit board arrangement.

A low power electrical circuitry component according to the invention comprises a plurality of laminae held together in a stacked relationship, each lamina carrying electrical conductors so arranged that no conductors on one said lamina cross and wherein inter-connections between conductors of different said laminae are made in a direction substantially perpendicular to the plane of the laminae.

In the multi layer component provided by the invention the crossing connections are easily made by a lamina above or below the lamina carrying the circuit, normally a printed circuit, which has a crossing requirement and/or circuit density enhancement requirements.

In an embodiment of the invention it is possible to form recesses or apertures by milling, turning out or moulding in the laminae to receive items such as transistors, capacitors and so on to be connected in the circuitry.

The multi layer construction allows the items to be dropped in by an assembly machine, to self locate and be ready for connection by welding or soldering the conductors without the need for very accurate placing machinery.

An advantage of recesses and apertures being provided is that laminae can be easily loaded at one station with one category of item say resistors of a certain value, moved with items of that category to the next station and so on to complete a component. This arrangement enables a more flexible production approach than the tape loading method currently in use.

This arrangement is particularly advantageous for including logic items such as micro chip wafers. At present the wafers are encapsulated and the connections which protrude from the capsule (now a chip) are then soldered on. The encapsulation is generally bulky in the context of the tiny size of the wafer and in the present invention can easily be eliminated by locating a wafer in a recess and effectively encapsulating it in the assembly of laminae.

A further advantage of the invention is the increased strength of the circuitry which assists replacement by relatively unskilled maintenance staff, and increases component reliability.

In a further embodiment the recesses or apertures are connected to the outside of the component by ducts formed in the laminae of the invention or additional non-electrical laminae interleaved with the laminae carrying conductors. The ducts may be connected to cooling means which can be at low cryogenic temperatures. The advantages of this embodiment is that the heating effect of items such as resistors can be reduced. When cryogenic temperatures are used the components can be electrically much more efficient.

Embodiments of the invention will now be described with reference to the accompanying drawings in which:

FIGS. 2 to 4 are plan views of second, third and fourth laminae of the stack of which FIG. 1 shows the first part.

Figure 7:
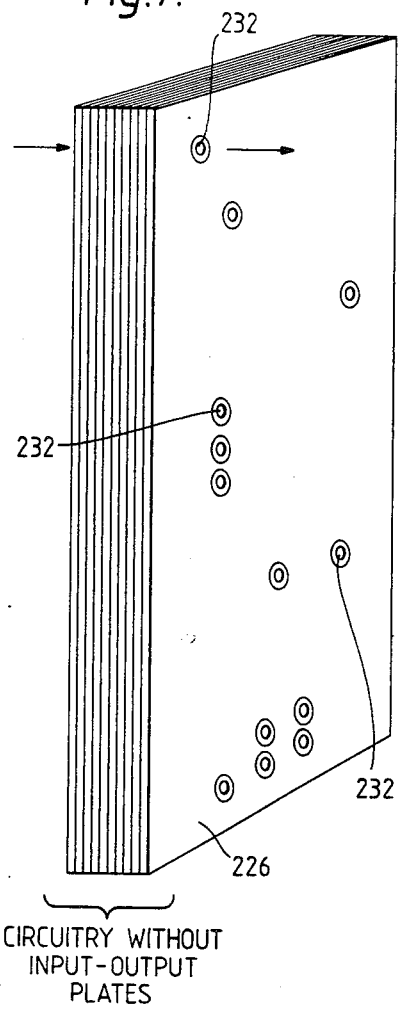
FIG. 7 is a perspective view of an assembled stack of laminae such as shown in FIGS. 1 to 6.
Figure 8:
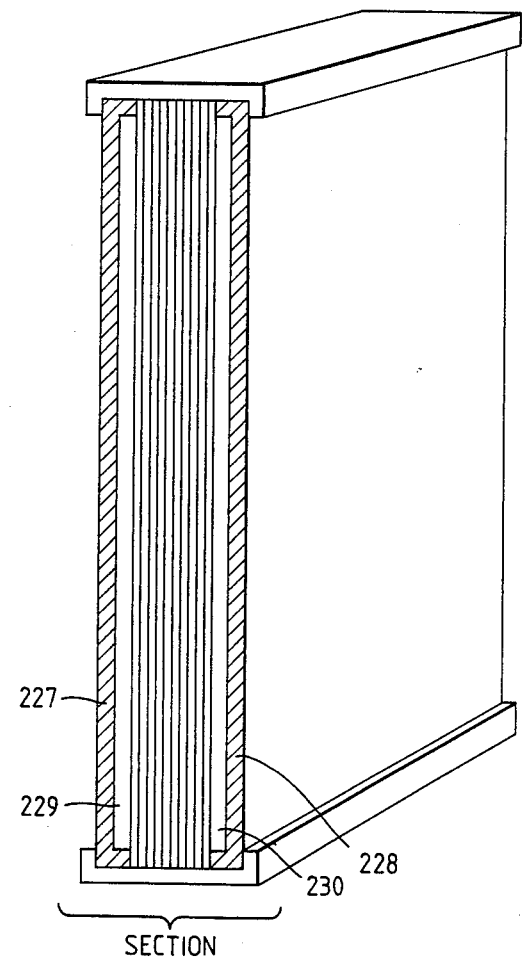

FIG. 8 in a perspective view of the stack of FIG. 7 with an outer casing.

Figure 9:
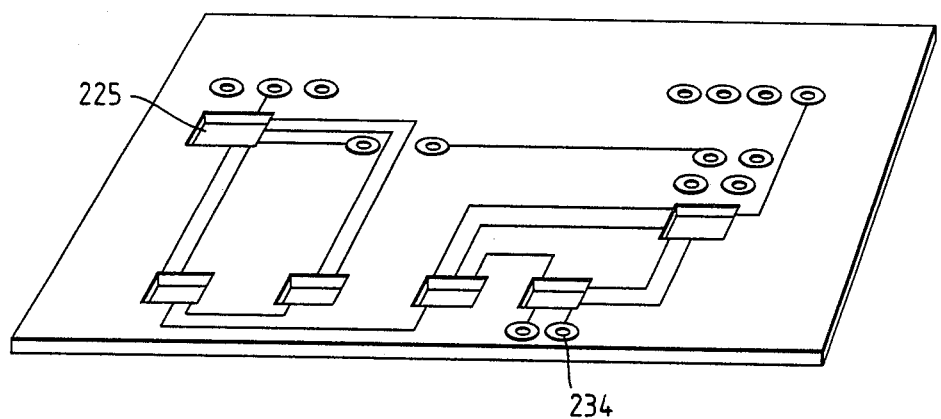

FIG. 9 is a perspective view of one lamina of a stack according to the invention showing electrical connections and cooling ports.

Figure 10:
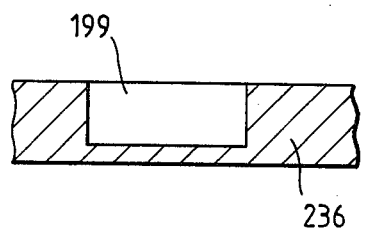

FIG. 10 is a cross section of a recess in a lamina of FIGS. 1 to 9 to receive an item such as a wafer.

Figure 11:
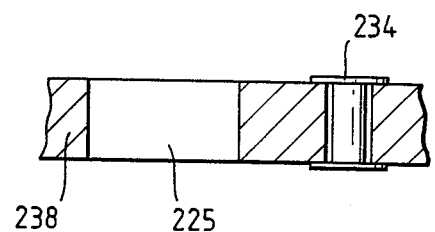

FIG. 11 is a cross section of an aperture in a lamina of FIGS. 1 to 9 to receive an item such as a wafer.

Figure 12:
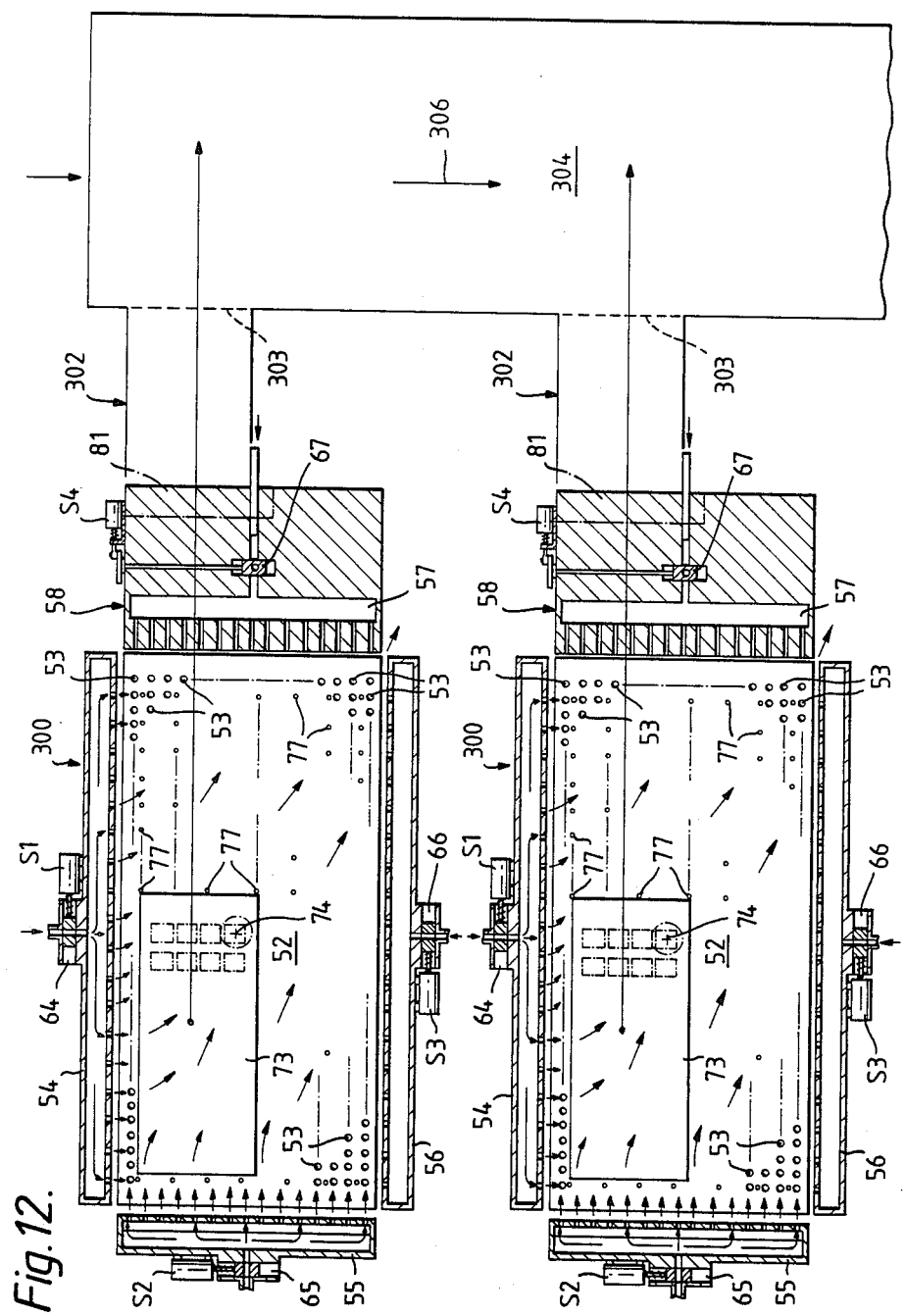

FIG. 12 shows in plan a coupled pair of milling and drilling formers for the production of the laminae for the components of the invention.

Figure 13:
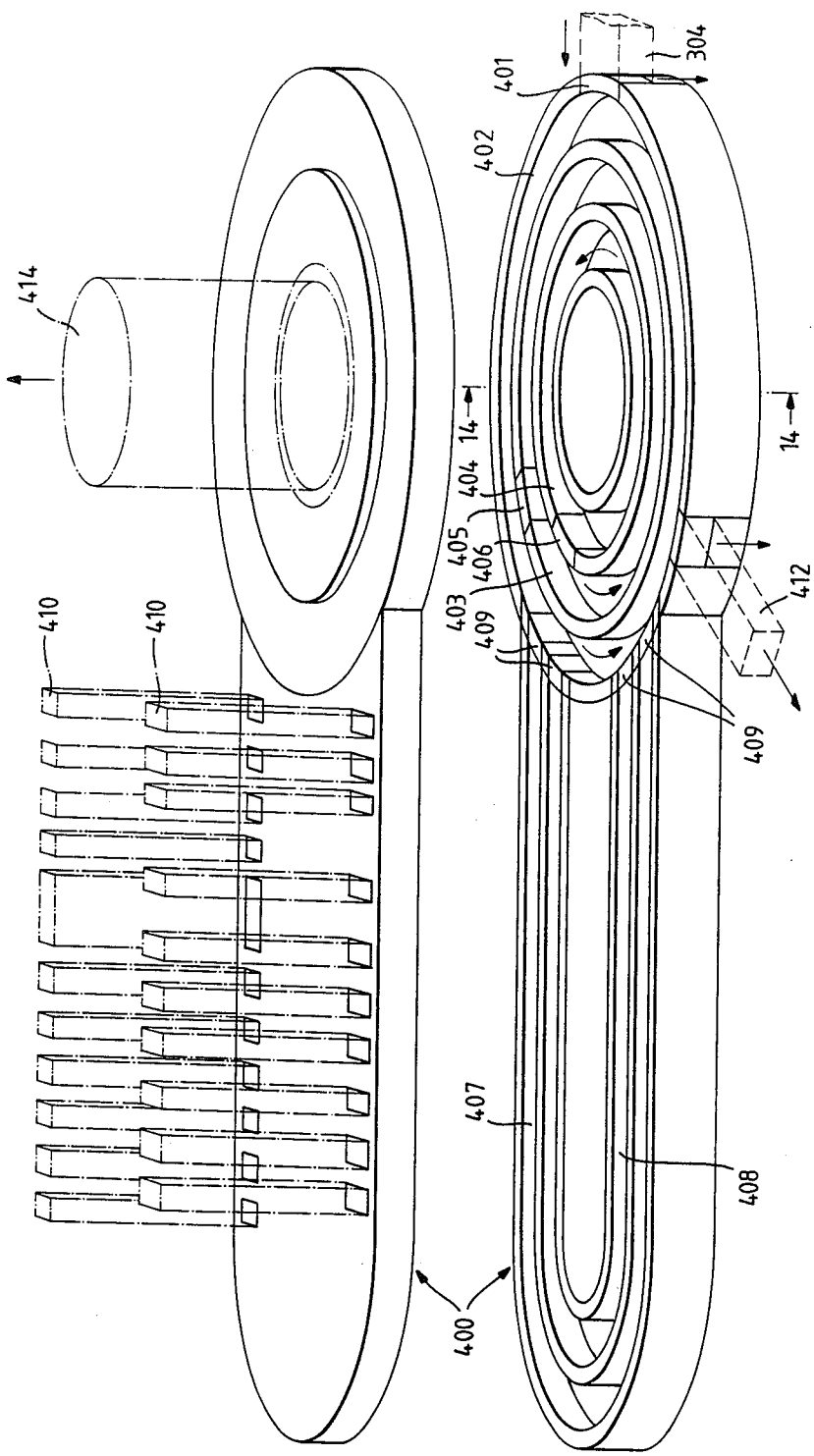

FIG. 13 is a partially exploded isometric view of a multi-station assembly device.

FIG. 14 is a section taken through the line 14—14 of FIG. 13.

Figure 1:
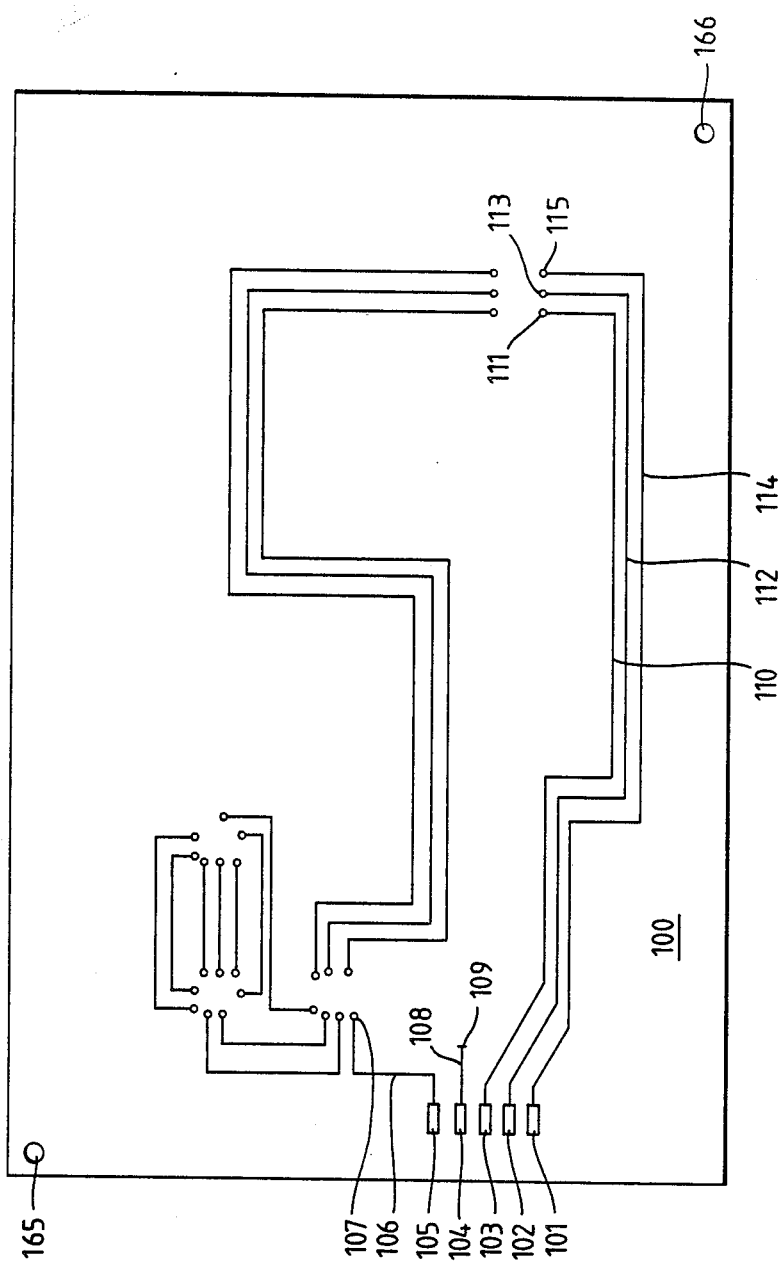
FIG. 1 is a plan view of a first lamina of a stack of a component according to the invention.
Figure 2:
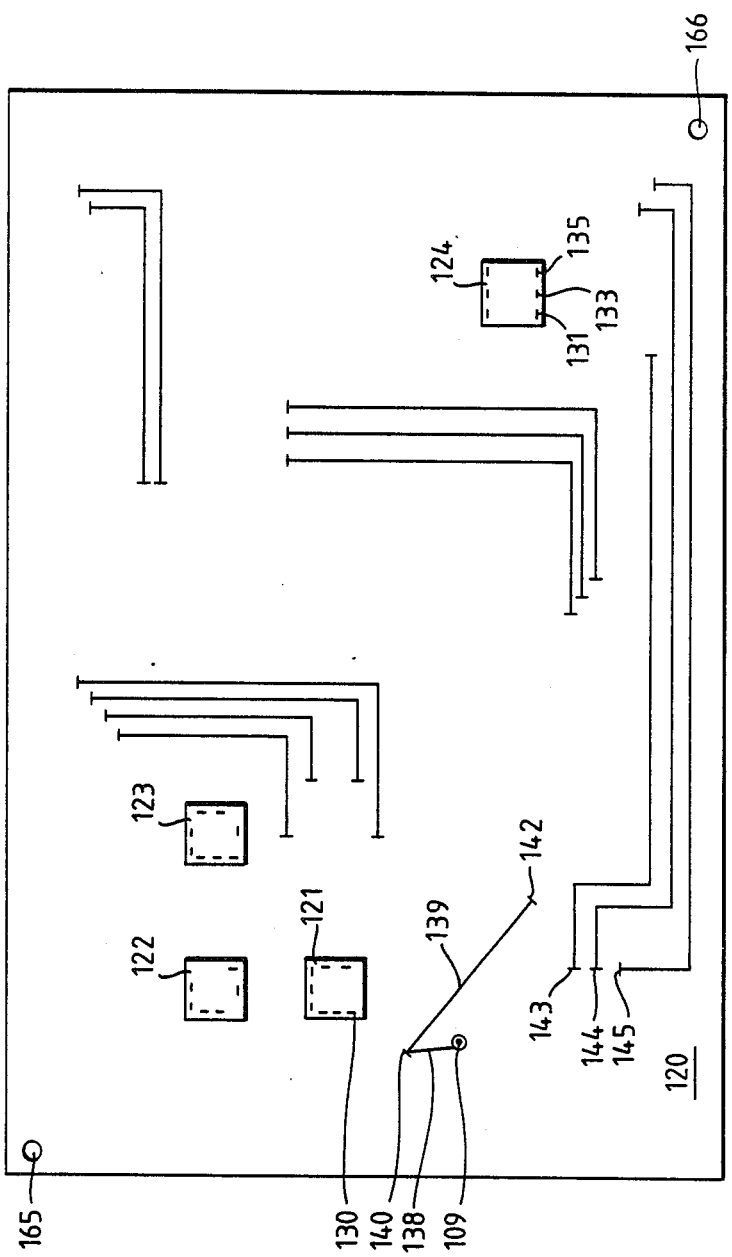
Figure 3:
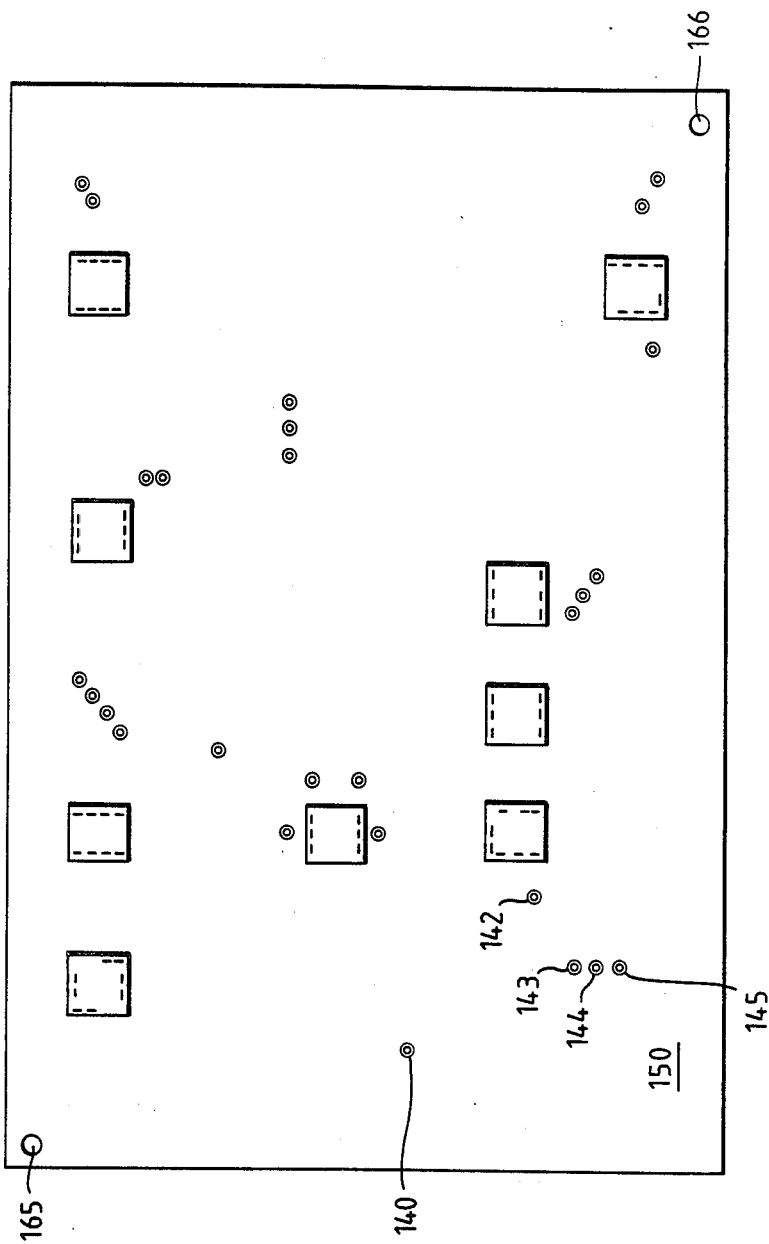
Figure 4:
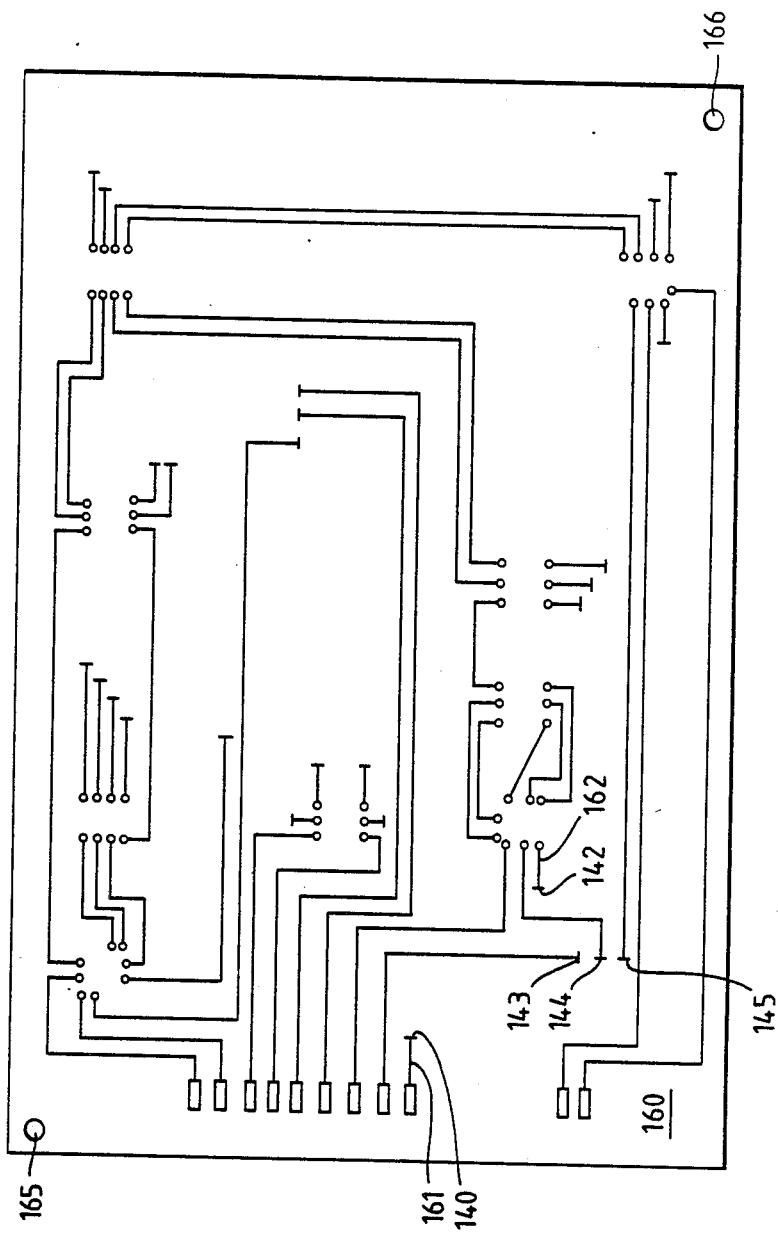

FIGS. 1 to 4 show a stack of four laminae carrying items such as integrated circuit wafers and the laminae in FIGS. 1, 2 and 4 having electrical conductors printed thereon:

In FIG. 1 the top lamina 100 is shown with five electrical connections 101 to 105 to the outside. Connection 105 is connected to electrical conductor 106 and thence to a down lead 107. Connection 104 is connected to a down lead 109 by conductors 108. Connection 103 is connected to down lead 111 by conductor 110, 102 to down lead 113 by conductor 112 and 101 to down lead 115 by conductor 114.

In FIG. 2 the next lamina 120 below top lamina 100 holds items 121, 122, 123 and 124, which may be integrated circuit wafers, in recesses 199 (FIG. 10) formed in the thickness of the lamina. Down lead 107 connects to point 130 on 121 whilst down leads 111, 113 and 115 connect to points 131, 133 and 135 respectively on item 124.

Down lead 109 from lamina 100 connects on lamina 120 to conductor 138 which connects with down lead 140 and via conductor 139 to down lead 142. Down leads 140 and 142 extend through the next lamina 150 to conductors 161 and 162 on bottom lamina 160. Similarly down leads 143, 144 and 145 extend through lamina 150 to 160.

The above connections are only some of very many shown in FIGS. 1 to 4 which may easily be seen if the actual Figures are brought into registration with each other against a light. Rivet holes 165 and 166 are provided in each lamina to ensure final assembly.

It will be seen from the above figures that there is plenty of opportunity for cross over connections as between laminae whilst each lamina can be simple with no crossing conductors.

Figure 5:
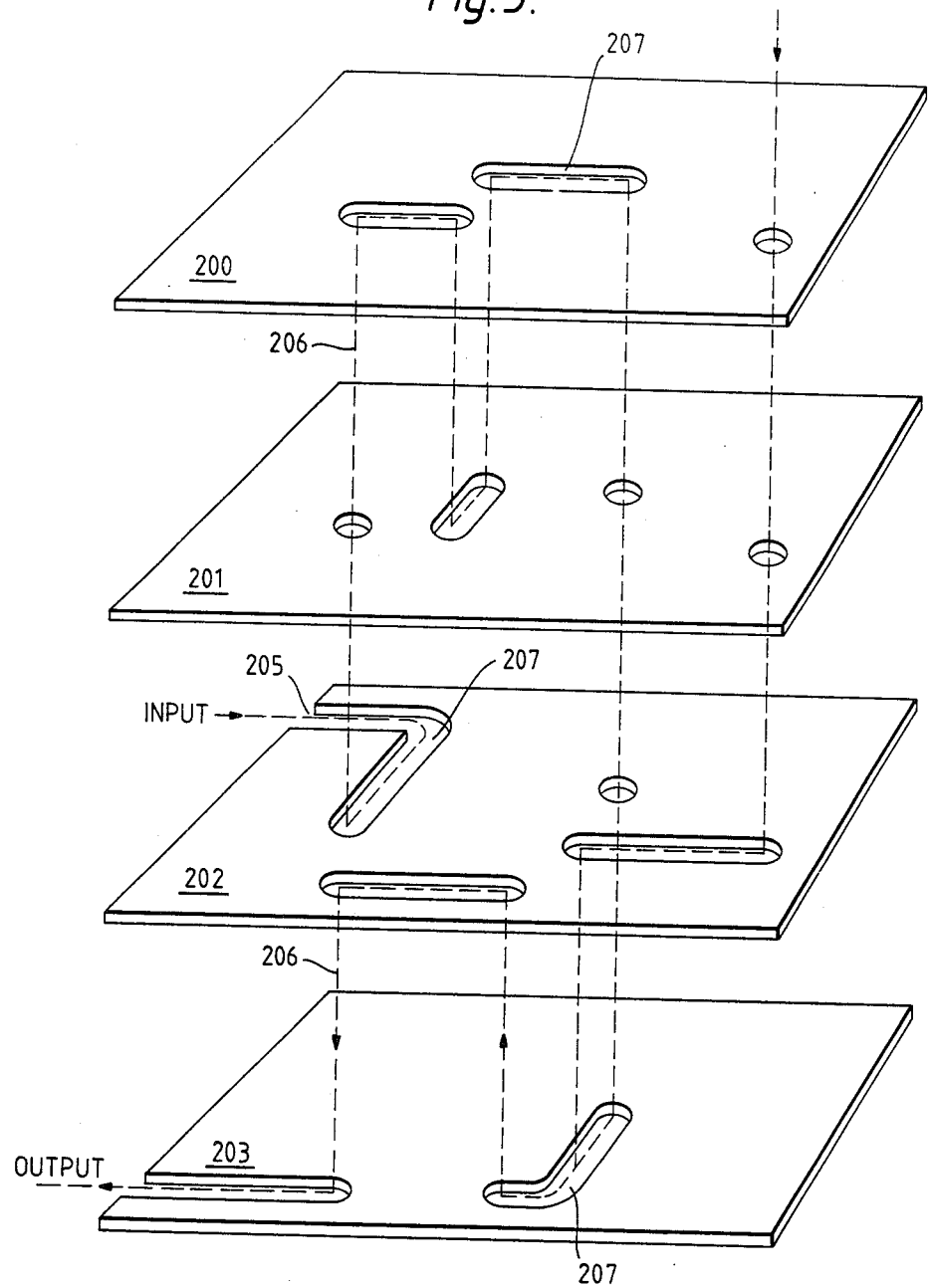
FIGS. 5 and 6 are exploded view of stacks according to second and third embodiments of the invention showing cooling channels in and between laminae similar to those shown in FIGS. 1 to 4.

In a further embodiment of the invention shown in FIG. 5 provision is made between the laminae for cooling by providing gas channels. In order to keep the drawings simple the electrical connections are not shown in this figure.

In FIG. 5 four laminae (more are provided but not shown) 200, 201, 202 and 203 have a gas input on lamina 202 at 205. Gas then travels along broken lines 206 to output 203. The gas flow is directed by milled out portions 207 around items such as resistors.

Figure 6:
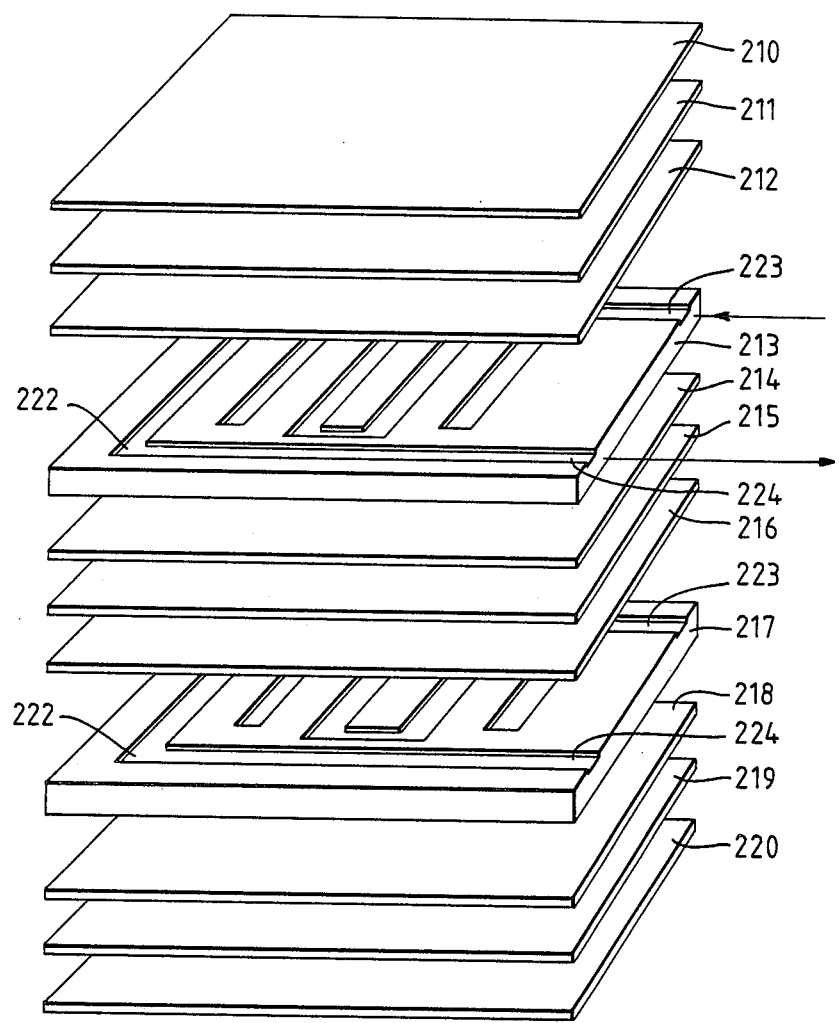

FIG. 6 shows another embodiment of the invention not showing the electrical circuitry but showing labyrinthine cooling systems 222 in laminae 213 and 217 with inlets and outlets 223 and 224 respectively. The circuitry is mainly provided on and between laminae 210–212, 214–216 and 218–220. This arrangement is unstable for cooling items such as wafers using apertures 225 as shown in FIG. 11.

In order to ensure a good mechanical linking of the laminae they may be rivetted together as already described or else a stack 226 of laminae may be clamped together as shown in FIG. 8. The clamps providing covers for inlets and outlets 229 and 230 which connect with ports 232.

FIG. 9 shows a lamina for a stack with apertures 225 for wafers and other items, and connections between laminae made by rivets 234. If necessary the rivets can be hollow and used as cooling ducts.

FIGS. 10 and 11 have been already described and show laminae 236 and 238 with recess 199 and aperture 225 respectively.

My U.S. Pat. No. 4,226,526 shows and describes a circuit board processing mechanism and FIG. 12 shows two such mechanisms 300 in parallel. More such mechanisms may be provided. Each mechanism is exactly as described in my said US Patent and need therefore not be further described. Circuit board laminae 73, or as referred to in said patent as "substrates", have the holes and channels milled by each mechanism.

Each mechanism 300 is connected by a conveyor duct 302 through a gate 303 which can be a solid shutter (not shown) to a main conveyor 304 where an air cushion similar to that used in each mechanism 300 conveys the milled or otherwise formed laminae in direction 306 to an assembly device with a station or series of assembly stations where items such as transistors, capacitors, resistors, wafers and so on are added.

FIG. 13 shows on such assembly device at 400. Here laminae are fed by conveyor 304 to a gate 401 which drops to open to allow a lamina or series of laminae into a circular storage/sorting duct 402 where laminae can be moved to other circular ducts 403, 404 through gates 405, 406 or else moved directly to loading tracks 407, 408 through gates 409. Tracks 407, 408 have loading magazines 410 for items to be fixed/inserted in/on laminae. Outlets to the device may be at 412 or centrally through 414.

FIG. 14 shows the cicular tracks 402-404 with cushion jets 416 and gas supply duct 418 below. Laminae are supported as my aforesaid U.S. Pat. No. 4,226,526 and are driven around the circular tracks by air currents.

I claim:

1. A low power circuitry component comprising a plurality of laminae held together contiguously in a stack, each lamina carrying electrical conductors so arranged that no conductors of different said laminae cross and wherein inter-connections between conductors of different said lamine are made in a direction substantially perpendicular to a plane of the laminae and, gas ducting within the stack of laminae whereby a coolant may be caused to flow through the stack.

2. A component as claimed in claim 1 wherein at least one of the laminae of the stack has at least one recess therein to receive and at least partially enclose a circuit item.

3. A component as claimed in claim 1 wherein at least one of the laminae of the stack has at least one aperture therethrough to receive and at least partially enclose a circuit item.

4. A component as claimed in claim 1 wherein the ducting is formed by grooves in at least one lamina of the stack.

5. A component as claimed in claim 1 wherein at least one of the inter-connections between conductors of different said laminae comprises means for receiving at least one lead of an item within said stack for physical and electrical connection in said circuitry component.

* * * * *